United States Patent [19]
Stauffer et al.

[11] Patent Number: 5,707,783
[45] Date of Patent: Jan. 13, 1998

[54] MIXTURES OF MONO- AND DI- OR POLYFUNCTIONAL SILANES AS SILYLATING AGENTS FOR TOP SURFACE IMAGING

[75] Inventors: Craig M. Stauffer, Sunnyvale, Calif.; William R. Peterson, Phoenix, Ariz.

[73] Assignee: Complex Fluid Systems, Inc., Santa Clara, Calif.

[21] Appl. No.: 566,666

[22] Filed: Dec. 4, 1995

[51] Int. Cl.$^6$ .................. G03C 5/56; G03C 1/60
[52] U.S. Cl. .................. 430/313; 430/315; 430/286.1
[58] Field of Search .................. 430/272.1, 302, 430/306, 309, 313, 286.1, 315

[56] References Cited

U.S. PATENT DOCUMENTS

| | | | |
|---|---|---|---|
| 4,551,418 | 11/1985 | Hult et al. | 430/325 |
| 4,552,833 | 11/1985 | Ito et al. | 430/325 |
| 4,626,556 | 12/1986 | Nozue et al. | 522/99 |
| 4,782,008 | 11/1988 | Babich et al. | 430/313 |
| 4,808,511 | 2/1989 | Holmes | 430/325 |
| 5,023,164 | 6/1991 | Brunsvold et al. | 430/270 |
| 5,116,715 | 5/1992 | Roland et al. | 430/190 |
| 5,312,717 | 5/1994 | Sachdev et al. | 430/313 |
| 5,322,765 | 6/1994 | Clecak et al. | 430/326 |
| 5,366,852 | 11/1994 | Pavelchek et al. | 430/324 |
| 5,384,220 | 1/1995 | Sezi et al. | 430/8 |
| 5,429,673 | 7/1995 | Peterson et al. | 106/287.11 |

OTHER PUBLICATIONS

Stauffer, C.M., et al., "Processes and Applications of Silylation", presented at SEMICON/Sansai 95 ULSI Technology Seminar, Semiconductor Equipment and Materials International (SEMI), Osaka, Japan Jun. 22–23, 1995.

Irmscher, M., et al., "Realisation of Irregular Quarter–Micron Patterns in Thick Resists Using an Advanced E–Beam Sensitive TSI Process," *Microelectron. Eng.* (Jan. 1996) 30(1–4): 301–304.

Pavelchek, et al., "Process Techniques for Improving Performance of Positive Tone Silylation," *Proc. SPIE–Int. Soc. Opt. Eng.* (1993) 1925: 264–269 [Advances in Resist Technology and Processing, vol. X].

Baik, et al., "A Comparative Study Between Gas– and Liquid–Phase Silylation for the DESIRE Process," *J. Vacuum Soc. Technol. B.* (Nov.–Dec. 1991) 9(6): 3399–3405.

Sebald, M. et al., "Chemical Amplification of Resist Lines (CARL)," *Microelectron. Eng.* (1990) 11(1–4): 531–534.

Sezi, R., et al., "Aqueous Phase Silylation, A New Route to Plasma Developable High Resolution Resists," *Microelectron. Eng.* (Apr. 1990) 11(1–4): 535–538.

Calabrese, G.S., et al., "Process Enhancements for Positive Tone Silylation," *Microelectron. Eng.* (Apr. 1993) 21(1–4): 213–234.

Babich, E., et al., "Comparison of Vapor and Liquid Phase Silylation Processes of Photoresists," *Microelectron. Eng.* (1991) 13: 47–50.

*Primary Examiner*—Janet C. Baxter
*Assistant Examiner*—Rosemary Ashton
*Attorney, Agent, or Firm*—Townsend and Townsend and Crew

[57] ABSTRACT

Top surface imaging by silylation of organic photoresists for use in lithographic techniques for the manufacture of microelectronic devices is improved by the use of certain mixtures of organosilane silylating agents. The mixture includes a monofunctional silane in combination with a di- or polyfunctional silane, selected such that the boiling points are the same or very close to each other to facilitate a vapor-phase reaction. Silylation with this mixture provides effective penetration of the silane into the resist without causing so much lowering of the glass transition temperature of the resist that the resist flows under the processing steps and distorts the pattern.

24 Claims, No Drawings

MIXTURES OF MONO- AND DI- OR POLYFUNCTIONAL SILANES AS SILYLATING AGENTS FOR TOP SURFACE IMAGING

This invention resides in the field of silylation and silylating agents, and their use in the formation of high-resolution circuitry on microelectronic devices.

BACKGROUND OF THE INVENTION

Lithography has long been used in forming circuitry on microelectronic devices such as semiconductor chips and chip carders. The capabilities of conventional lithographic techniques have been challenged however by current generation devices which require circuitry of increasing density and circuit features of high resolution. To accommodate these requirements, the conventional wet develop method of lithography has been replaced in certain applications by a dry develop method in which oxygen plasma is used as the developing medium. By virtue of its anisotropy, the plasma develop forms an image of superior sharpness and resolution, even in a thick resist.

One means by which the dry develop method is made possible is Top Surface Imaging (TSI). In TSI, the resist surface is silylated in a pattern that is a positive image of the circuitry and either a positive or a negative image of the lithography mask. The plasma etch then erodes the nonsilylated areas at a much faster rate than the silylated areas, to achieve a well-defined resist profile that exposes the underlying thin-film substrate in a pattern that forms a closely matched negative of the silylation pattern originally imposed on the resist surface.

One method of TSI that forms a positive image of the lithography mask is by use of a resist that consists of a noncrosslinked polymeric material containing reactive protic groups, formulated to include an unreacted crosslinker such as a melamine and a photoacid generator that releases acid upon exposure to actinic radiation. Imagewise exposure of the resist releases the acid which upon heating of the resist catalyzes the crosslinking reaction at the protic groups in the polymer, rendering these groups no longer available for reaction. The protic groups in the unexposed regions remain intact and thereby retain their reactivity. Silylation is then performed by contacting the entire resist with an organic silicon compound that contains a hydrolyzable bond at the silicon atom, under conditions that cause hydrolysis and bonding of the silicon atom to the protic group in the resist.

A further method for forming a positive image of the mask is by the use of a resin which is directly crosslinked by exposure to deep ultraviolet (DUV) radiation without the presence of a photoacid generator. Here again, the unexposed (and thereby noncrosslinked) areas will be selectively silylated, leaving the crosslinked resin unsilylated.

A method by which TSI is used to form a negative image of the mask is the diffusion enhanced silylated resist (DESIRE) process. The resist in this process contains a novolac resin plus 2-1-5 diazonaphthaquinone (DNQ). Imagewise exposure to ultraviolet light causes decomposition of the DNQ in the exposed areas, releasing nitrogen and forming a carboxylic acid. This is followed by baking of the resist which causes decarboxylation in the exposed areas, while the DNQ remaining in the unexposed areas esterifies and crosslinks the novolac chains, rendering them incapable of silylation. The entire resist surface is then contacted with the silylating agent with the result that the exposed areas become selectively silylated.

Other methods for a negative image of the mask are those involving resists with silylation sites which are blocked but can be deblocked by exposure to DUV. Examples of these resists are the CAMP (chemically amplified positive) resist of Bell Laboratories, Inc., Madison, Wis., USA, and the APEX resist of IBM Corporation, White Plains, N.Y., USA. Both resists use styrenes protected by tert-butoxycarbonyl (tBOC) groups. Exposure to DUV deprotects the reactive sites and generates a small amount of acid, and a subsequent bake increases the reaction intensity. The deprotected reactive sites will then be selectively silylated.

The current state of the art for such devices as memories, microprocessors and logic circuits calls for lithographic feature sizes of 0.35 micron or below, and optical exposure techniques at a wavelength of 193 nm have been shown to be capable of producing features having a critical dimension of less than 0.08 micron. To maintain resolution in lithographic patterning in these sub-micron regimes, the dimensional stability of the polymer resists throughout all stages of the above procedures becomes increasingly important. The incorporation of organosilicon groups in the polymer film is detrimental to this stability because these groups generally lower the glass transition temperature ($T_g$) of the polymer, causing it to flow. Also, the incorporation of organosilicon groups causes the polymer to swell, which results in lateral expansion and overflow of the silylated polymer into adjacent regions. Both effects obscure the image.

In an attempt to minimize the adverse effects of silylation, researchers have proposed using dimethylsilyl species as the silylating agent since these species entail less expansion of the polymer film. While these species achieved this effect, however, they did not lessen the drop in $T_g$, but instead produced an even greater drop.

A two-step silylating procedure, termed Silylated Acid Hardened Resist (SAHR™), is disclosed by Calabrese, G. S., et al. ("Process Enhancements for Positive Tone Silylation," *Microelectronic Engineering* 21(1–4):231–234 (1993)). The first step in this procedure uses a bifunctional silane while the second uses a monofunctional silane, the bifunctional silane crosslinking the resist surface to lessen the flow resulting from incorporation of the monofunctional silane. While this proved effective for 0.5 micron features, it was less so for features under 0.25 micron.

An alternative method is one involving the formation of a trench or surface depression in the areas to be silylated, prior to the silylation of those areas. The trench is formed by a presilylation development (PSD) using a wet develop method immediately after the imagewise exposure and baking of the resist. The swelling that accompanies the silylation causes the polymer below the trench to rise and refill the trench. The trench thus contains the swelling and prevents overflow of the silylated polymer into the adjacent regions. Unfortunately, the process is sensitive to the choice of resist material and lacks reproducibility since it relies on characteristics of the resists that are not sufficiently controllable. In addition, the dissolution rate in the PSD step and the swelling rate in the silylation step are not proportional to each other, which lessens the usefulness of the procedure.

The use of two resist layers, i.e. , a low $T_g$ resist layer supported underneath by a high $T_g$ resist layer (termed a "planarizing layer"), has also been disclosed. Since the low $T_g$ of the upper layer permits greater diffusion than the lower layer, imagewise exposure is performed on the upper layer, which is then wet developed down to the interface between the layers. Silylation is then performed, resulting in selective silylation of the remaining regions of the upper layer due to its greater receptivity to the silylating agent. The oxygen plasma etch then removes the high $T_g$ layer in the exposed regions. This eliminates the flow problem but requires an extra resist layer and one having a high $T_g$.

A variation on this process, but still involving a patterned resist layer, is that known as "Chemical Amplification of Resist Lines (CARL)."

SUMMARY OF THE INVENTION

It has now been discovered that Top Surface Imaging with a high fidelity image and minimal if any distorting flow of the resist is achieved by the use of a silylation composition that comprises a mixture of two organosilanes, one of which is monofunctional and the other di- or polyfunctional. The monofunctional silane is included in a sufficient amount to penetrate the polymer fill sufficiently to provide effective resistance to the plasma etch during dry development, and the di- or polyfunctional silane is included in a sufficient amount to prevent or reduce the deleterious effect of $T_g$ lowering. This combination provides a reproducible and highly controllable result, avoids the need for a presilylation development, and avoids the need for multiple layers of resist.

This invention is applicable to any process which involves selective silylation following imagewise exposure of a resist, regardless of whether the silylation pattern is a positive or a negative image of the lithography mask. This includes each of the resists and processes mentioned under the heading "Background of the Invention" above. Thus, in the broadest sense, the invention is implemented by:

(a) applying the resist to the substrate as a continuous film;

(b) exposing the resist in imagewise manner, possibly followed by baking the resist or other procedural steps, or both, according to the type of resist used, to define regions on the fill that are selectively susceptible to silylation relative to other regions on the film, in accordance with the image;

(c) silylating the resist with the organosilane mixture, resulting in both silylated and nonsilylated areas according to the image; and (d) etching away the nonsilylated areas by dry development.

The resist will thus be any resist which undergoes a chemical change upon imagewise exposure, with or without a subsequent bake step. The chemical change is one which either imparts a susceptibility to silylation, i.e., reactivity with a silylating agent, to a resist which is otherwise not susceptible to silylation, or one which renders a resist which is otherwise reactive toward a silylating agent nonreactive toward that agent. The chemical change may thus be either a decomposition, a transformation of an ingredient from a reactive (or catalytic) to a nonreactive (or noncatalytic) form or from a nonreactive (or noncatalytic) to a reactive (or catalytic) form, or a crosslinking reaction. The regions on the film which are selectively reactive as a result of this change are thus either those that were exposed or those that were unexposed. The specific type of reactivity relative to silylation will depend upon the functionality of the silylating agent, which is preferably a hydrolyzable moiety on the organosilane.

Once the resist has been silylated in a patterned manner using the silylation composition of monofunctional and di- or polyfunctional organosilanes, the thin film layer underneath the resist is etched through the open regions of the resist, and the resist is then stripped, both by conventional techniques.

Details of these and other features, advantages and applications of the invention will become apparent from the following description.

DETAILED DESCRIPTION OF THE INVENTION AND PREFERRED EMBODIMENTS

The monofunctional organosilane of the organosilane mixture of the present invention is an organosilane having one or more silicon atoms and a single (i.e., only one) hydrolyzable moiety bonded to a silicon atom. The compound may thus contain a single silicon atom bonded to a single hydrolyzable moiety. In cases involving a hydrolyzable moiety that has a valence of two or greater, the organosilane may contain two or more silicon atoms bonded to a common hydrolyzable moiety that is the only hydrolyzable moiety in the compound. The term "monofunctional" is used herein to denote that the reaction between the organosilane and the polymer will result in silicon atoms each bearing only a single linkage to the polymer at the location of a protic group on the polymer, even if the organosilane reactant contains more than one silicon atom. Thus, the monofunctional organosilane is one which will not crosslink the polymer chains. Preferred monofunctional organosilanes are those containing at most three silicon atoms, more preferred are those containing one or two silicon atoms.

The di- or polyfunctional organosilane is an organosilane having one or more silicon atoms and at least two hydrolyzable moieties. Upon reaction with the protic groups on the polymer, the organosilane will join two or more of the protic groups, thereby crosslinking the polymer. The organosilane may thus contain a single silicon atom bonded to two or more hydrolyzable moieties, or two silicon atoms joined by a non-hydrolyzable linkage but each bonded individually to a separate hydrolyzable moiety, or other variations. The term "di- or polyfunctional" is used herein to denote that the reaction between the organosilane and the polymer will result in a silicon atom crosslinking the polymer chains by simultaneously bonding to the locations of two or more protic groups on different chains. Preferred monofunctional organosilanes are those containing at most three silicon atoms, more preferred are those containing one or two silicon atoms.

The term "hydrolyzable group" in the context of this invention denotes any group that when bonded to a silicon atom will be cleaved from the silicon atom upon reaction of the organosilane with the protic group on the polymer. Examples of such hydrolyzable groups are amino ($-NH_2$), alkylamino ($-NHR$, where R is alkyl), dialkylamino ($-NR^1R^2$, where $R^1$ and $R^2$ are alkyl, either the same or different), alkanoylamino ($-NHC(O)R$, where R is alkyl), alkoxy ($-OR$, where R is alkyl), and alkanoyloxy ($-OC(O)R$, where R is alkyl). Preferred among these are di($C_1$–$C_3$ alkyl)amino, $C_1$–$C_4$ alkoxy, and $C_2$–$C_5$ alkanoyloxy. Specific examples are dimethylamino, diethylamino, methoxy, ethoxy, propoxy, acetoxy, propionyloxy ($-OC(O)C_2H_5$), and butyryloxy ($-OC(O)C_3H_7$).

Examples of monofunctional organosilanes in accordance with this invention are:

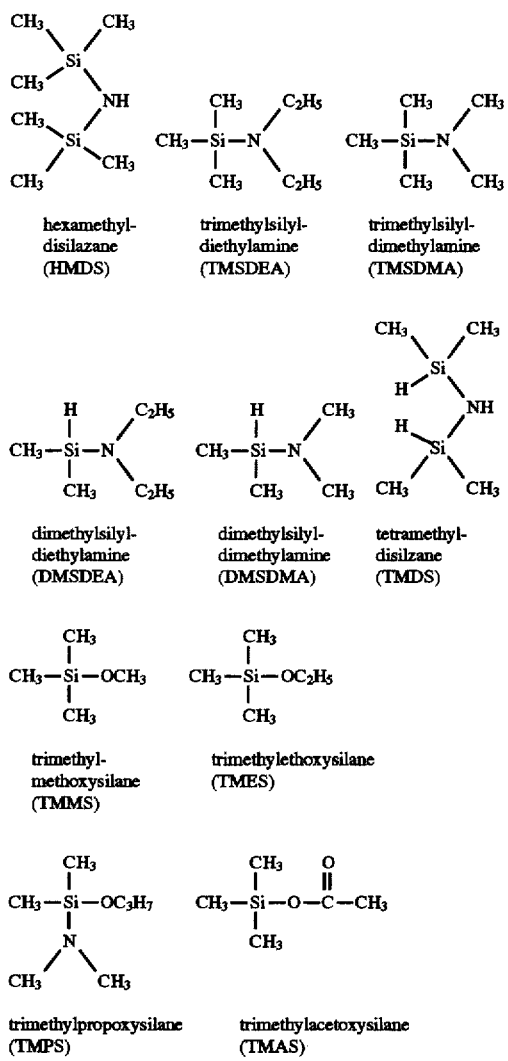

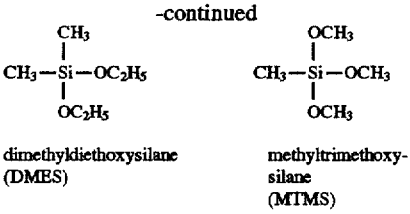

dimethyldiethoxysilane (DMES)

methyltrimethoxysilane (MTMS)

The organosilane mixtures of this invention may contain two or more of each type of organosilane, i.e., two or more monofunctional organosilanes combined with a single di- or polyfunctional silane, two or more di- or polyfunctional silanes combined with a single monofunctional silane, or two or more of both types. In general, however, the benefits of the invention will be obtained with a mixture of one of each type.

The silylation reaction is performed in accordance with known techniques, which include both liquid-phase and vapor-phase methods. Preferred methods are those in which the organosilane mixture is vaporized prior to contact with the polymer surface. This may be achieved by diluting the organosilane mixture in an inert carrier gas such as nitrogen or argon, by injecting the organosilane mixture into the reaction zone through an orifice, or by mechanically spraying the mixture into a heated area from which the resulting vapor is transported by an inert gas or by vacuum into the reaction zone. For best results in maintaining a uniform deposition or reaction rate of the entire organosilane mixture in a vapor-phase reaction, the components of the mixture will be selected such that their boiling points differ by no more than 5 degrees Celsius. Particularly preferred combinations are those whose boiling points differ by 2 degrees Celsius or less. Of the individual organosilanes, those having boiling points (or boiling temperature ranges) within the range of about 30° C. to about 200° C. are preferred, and those within the range of about 50° C. to about 150° C. are the most preferred. To further ensure best results, the components are selected to achieve compatible mixtures, compatibility being measured in terms of miscibility and reaction rate. Thus, particularly favorable results are achieved when the hydrolyzable substituent groups are compatible.

Examples of organosilane mixtures demonstrating these attributes are as follows. (For each mixture, the monofunctional component is listed first, and the boiling point or boiling point range of each component is shown in parentheses. The formulas for these acronyms are those shown above.)

TMAS (103°–4° C.)+MTMS (102°–3° C.)

DMSDEA (109°–110° C.)+BAMS (111°–112° C.)

TMMS (57°–8° C.)+MDMS (61° C.)

TMPS (101°–2° C.)+MDAES (100°–107° C.)

TMSDMA (86°–7° C.)+DMDS (82° C.)

TMDS (100° C.)+MDAES (100° C.)

HMDS (126°–7° C.)+BDMADMS (128°–9° C.)

TMSDEA (126°–7° C.)+BDMADMS (128°–9° C.)

TMMS (57°–8° C.)+MDMS (61° C.)

DMSDEA (109°–110° C.)+DMES (114°–5° C.)

The proportion of silanes in the mixture can vary widely. Best results will be obtained, however, with mixtures in which the monofunctional organosilane (or monofunctional organosilanes, if more than one are present) comprise(s) at least half of the organosilane mixture by weight. Preferred weight ratios of the monofunctional organosilane(s) to the Examples of di- and polyfunctional organosilanes in accordance with this invention are:

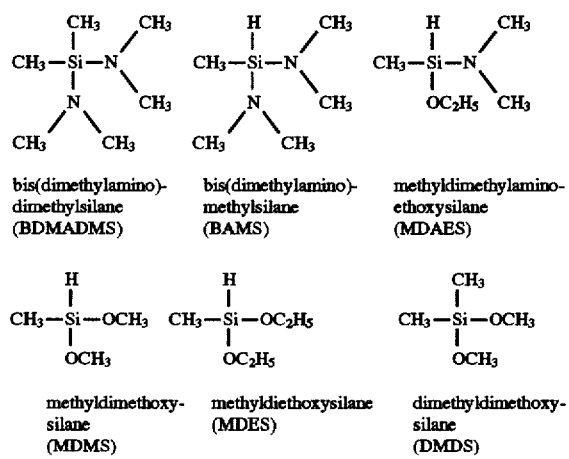

di- or polyfunctional organosilane(s) are those within the range of about 95:5 to about 55:45, and the most preferred are those within the range of about 80:20 to about 60:40.

A resist of particular interest for the application of this invention is a mixture of a noncrosslinked polymeric material containing reactive protic groups, an unreacted crosslinker such as a melamine and a photoacid generator that releases acid upon exposure to actinic radiation. As described in the Background section of this specification, exposure of this resist to actinic radiation releases the acid which upon heating of the resist catalyzes the crosslinking reaction at the protic groups in the polymer. Imagewise exposure thus results in a pattern of exposed areas which have few or no protic groups (i.e., an insufficient number) available for silylation and unexposed areas which do have protic groups available for silylation. Exposure of the resist to the hydrolyzable organosilane silylating agent thereby results in silylation at the unexposed areas of the film.

The term "protic" is used herein analogously to its use in the more commonly used term "protic solvents," i.e., to mean groups that have a hydrogen atom that forms hydrogen bonds. Examples of reactive protic groups are —$NH_2$ (amino), —NH(alkyl) (alkylamino), —NH— (imino), —OH (hydroxy), —SH (mercapto), —COOH (carboxy), —CHO (formyl), —$SO_3H$ (sulfo), and —$P(O)(OH)_2$ (,phosphono). Preferred among these are imino, hydroxy and mercapto, with hydroxy and mercapto more preferred, and hydroxy the most preferred.

The polymer may be any conventional resist polymer that contains these groups or mixtures of these groups. Examples are polyvinylphenols, polyhydroxystyrenes, poly(p-formyl) oxystyrenes, poly(t-butoxycarbonyloxystyrene), phenol-formaldehyde polymers, melamine-formaldehyde polymers, polyvinylpyrrolidone, polymethylisoprenylketone, polyvinylalcohol, and acrylic resins such as polymethacrylate, polymethylmethacrylate, and poly(t-butyl)methacrylate. Preferred polymers are those in which the reactive protic groups are hydroxy groups bonded to phenyl rings. Some of the most preferred polymers are polyvinylphenols and phenol-formaldehyde polymers, particularly novolaks and cresol novolaks.

The resist may include additional substances used in conventional resist formulations, particularly for those to which surface silylation is known in the art. These additional substances may include, for example, additional polymers, sensitizers, photoacid generators, crosslinking agents, speed enhancers, flexibility enhancers; adhesion enhancers, heat resistance enhancers, and surfactants. Examples of sensitizers are diazoquinones such as naphthoquinone-(1,2)-diazide sulfonic acid esters, and particularly the 5-sulfonic acid ester of diazonaphthoquinone. Examples of photoacid generators are diaryliodonium salts, triarylsulfonium salts, and substituted aryldiazonium salts, the salts having counterions such as tetrafluoborate, hexafluoroantimonate, hexafluoroarsenate and hexafluorophosphate. Other photoacid generators are halomethanes, trichlorotriazine, β-naphthol, nitrobenzaldehyde and polyvinylchloride. Formulated photoresists and photoresist components are widely available from commercial suppliers.

The glass transition temperature $T_g$ of the resist may vary, depending on the polymer itself and the types and quantities of other ingredients of the resist formulation. In general, best results will be obtained with resists having $T_g$ within the range of about 50° C. to about 120° C., and preferably from about 70° C. to about 100° C.

The thickness of the resist may vary considerably. In most applications, the resist will have a thickness within the range of about 0.5 micron to about 30 microns.

Conventional methods are used for the application, imagewise exposure and baking of the photoresist, prior to the silylation reaction. Spin coating followed by prebake is a primary example of an application technique. Exposure can be performed using UV light, e-beam, X-ray, ion beam, or combinations. Baking of the resist following exposure but prior to silylation is generally performed at temperatures within the range of about 70° C. to about 200° C., and preferably from about 100° C. to about 150° C., but will vary depending on the chemical composition of the resist. The silylation reaction is generally performed at a temperature ranging from about 20 to about 50 degrees Celsius below the boiling temperatures (at atmospheric pressure) of the organosilanes to slightly above the boiling temperatures. The chemistry pressure of the organosilanes, i.e., the partial pressure in the vapor phase, will generally range from about 20 torr: to about 500 torr:, and preferably from about 35 torr: to about 200 torr:. The use of oxygen plasma to perform a dry-develop subsequent to the silylation reaction is likewise known, and conventional techniques are used. Conventional techniques are also used for subsequent processing steps such as the subtractive etching and the stripping of the remaining resist.

The following examples are offered by way of illustration.

EXAMPLE 1

As a hypothetical procedure, silicon wafers are coated with SAL-601 photoresist (a novolac melamine onium salt, available from Shipley Co., Inc., Marlborough, Mass., USA) to a thickness of 1.1 microns, exposed with either photons by 248-nm monochromatic light at a dose of 30 mJ/$cm^2$ with a 5× reduction stepper, or electrons at 10 μC/$cm^2$ with a Hitachi HL-700D electron beam exposure system. Following the exposure, the wafers are baked at 118° C. for 90 seconds in the bake unit of a Genesis Microstar 200A Vapor Silylation Unit (Genesis, Santa Clara, Calif., USA). A mixture of 70% tetramethyldisilazane (TMDS) and 30% methyldimethylaminoethoxysilane (MDAES) (percents on weight basis) is then preheated to 65° C., and silylation of the resist-coated wafers is performed at a wafer temperature of 110° C. and chemistry pressure of 100 torr: in the adjacent Microstar 200 silylation unit for 120 seconds.

EXAMPLE 2

As a second hypothetical, the procedure of Example 1 is modified by substituting an organosilane mixture consisting of 65% dimethylsilyldimethylamine (DMSDEA) and 35% dimethyldiethoxysilane (DMES) (by weight), with preheating of the organosilane to a temperature of 50° C. and silylation at a wafer temperature of 85° C. and chemistry pressure of 40 torr.

EXAMPLE 3

As a third hypothetical, the procedure of Example 1 is modified by substituting an organosilane mixture consisting of 75% dimethylsilyldimethylamine (DMSDEA) and 25% bis(dimethylamino)methylsilane (BAMS) Coy weight), with preheating of the organosilane to a temperature of 55° C., and silylation at a wafer temperature of 90° C. and chemistry pressure of 50 torr.

EXAMPLE 4

In an actual experiment, the procedure of Example 1 was followed using a layer of SAL-601 applied to a thickness of 1.3 microns, exposed with electrons at a dose of 10 μC/$cm^2$ and treated with a mixture of 70% dimethylsilyldiethylamine (DMSDEA) and 30% bis(dimethylamino)methylsilane (BAMS) preheated to a temperature of 50° C. Silylation was performed at a temperature of 80° C. and a chemistry pressure of 60 torr for a duration of 150 seconds in a Genesis Microstar 200A.

The silylated resist images were examined using a Scanning Electron Microscope (SEM) at 50,000 magnification. The sample was prepared as a fractured cross-section of an image area that had been decorated in an oxygen plasma to enhance the visibility of the silylated area. The SEM photograph of the image showed a vaulted image top that extended beyond the normal resist surface in the vertical plane but did not show any evidence of lateral flow such as was seen when a 100% monofunctional silylating agent (DMSDEA) was used. The silylated area extended downward into the film. The vaulting observed showed that the swelling was restrained; the downward extension showed that the bi-functional silane did not significantly prevent penetration of the silylated area into the resist. The total silylated layer thickness was approximately 3,500Å in combined depth and swelling. A 100% bifunctional agent (BAMS) treatment would have been limited to about 1,000Å in combined swelling and depth.

The foregoing is offered primarily for purposes of illustration. It will be readily apparent to those skilled in the art that the operating conditions, materials, procedural steps and other parameters of the system described herein may be further modified or substituted in various ways without departing from the spirit and scope of the invention.

We claim:

1. A process for forming a relief image on a substrate, said process comprising:
   (a) coating said substrate with a film of a resist which is susceptible to a chemical change upon exposure to radiation;
   (b) treating said film by a procedure which includes imagewise exposure of said film to radiation to define regions on said film which are selectively susceptible, relative to the remainder of said film, to silylation by reaction with a hydrolyzable moiety on an organosilane;
   (c) treating said film with a composition in vapor form comprising a mixture of
      (i) a first organosilane having a single hydrolyzable moiety bonded to a silicon atom, and
      (ii) a second organosilane having at least two hydrolyzable moieties bonded to one or more silicon atoms,
      said first and second organosilanes having boiling points no more than about 5° C. apart, said first organosilane comprising at least about one-half of said mixture by weight; and
   (d) developing said film thus treated with an oxygen plasma.

2. A process in accordance with claim 1 in which said first and second organosilanes each contain at most three silicon atoms.

3. A process in accordance with claim 1 in which said hydrolyzable moieties are members independently selected from the group consisting of amino, alkylamino, dialkylamino, alkoxy, and alkanoyloxy.

4. A process in accordance with claim 1 in which said hydrolyzable moieties are members independently selected from the group consisting of di($C_1$–$C_3$ alkyl)amino, $C_1$–$C_4$ alkoxy, and $C_2$–$C_5$ alkanoyloxy.

5. A process in accordance with claim 1 in which said hydrolyzable moieties are members independently selected from the group consisting of dimethylamino, diethylamino, methoxy, ethoxy, propoxy, acetoxy, propionyloxy, and butyryloxy.

6. A process in accordance with claim 1 in which said first and second organosilanes each contain at most two silicon atoms.

7. A process in accordance with claim 1 in which said first and second organosilanes have boiling points ranging from about 30° C. to about 200° C.

8. A process in accordance with claim 1 in which said first and second organosilanes have boiling points ranging from about 50° C. to about 150° C.

9. A process in accordance with claim 1 in which the weight ratio of said first organosilane to said second organosilane is from about 95:5 to about 55:45.

10. A process in accordance with claim 1 in which the weight ratio of said first organosilane to said second organosilane is from about 80:20 to about 60:40.

11. A process in accordance with claim 1 in which said first organosilane is a member selected from the group consisting of hexamethyldisilazane, trimethylsilyldiethylamine, trimethylsilyldimethylamine, dimethylsilyldiethylamine, dimethylsilyldimethylamine, tetramethyldisilazane, trimethylmethoxysilane, trimethylethoxysilane, trimethylpropoxysilane and trimethylacetoxysilane, and said second organosilane is a member selected from the group consisting of bis(dimethylamino)dimethylsilane, bis(dimethylamino)methylsilane, methyldimethylaminoethoxysilane, methyldimethoxysilane, methyldiethyoxysilane, dimethyldimethoxysilane, dimethyldiethoxysilane, and methyltrimethoxysilane.

12. A process in accordance with claim 1 in which said mixture is a member selected from the group consisting of:
   (i) trimethylacetoxysilane and methyltrimethoxysilane,
   (ii) dimethylsilyldiethylamine and bis(dimethylamino)methylsilane,
   (iii) trimethylmethoxysilane and methyldimethoxysilane,
   (iv) trimethylethoxysilane and methyldimethylaminoethoxysilane,
   (v) trimethylsilyldimethylamine and dimethyldimethoxysilane,
   (vi) tetramethyldisilazane and methyldimethylaminoethoxysilane,
   (vii) hexamethyldisilazane and bis(dimethylamino)dimethylsilane,
   (viii) trimethylsilyldiethylamine and bis(dimethylamino)dimethylsilane,
   (ix) trimethylmethoxysilane and methyldimethoxysilane, and
   (x) dimethylsilyldiethylamine and dimethyldiethoxysilane.

13. A process in accordance with claim 1 in which said mixture is a member selected from the group consisting of (a) tetramethyldisilazane and methyldimethylaminoethoxysilane, (b) dimethylsilyldiethylamine and dimethyldiethoxysilane, (c) dimethylsilyldiethylamine and bis(dimethylamino)methylsilane, and (d) trimethylsilyldiethylamine and bis(dimethylamino)dimethylsilane.

14. A process in accordance with claim 1 in which said film prior to treatment in (b) has a thickness of from about 0.5 micron to about 30 microns.

15. A process in accordance with claim 1 in which said film prior to treatment in (b) has a glass transition temperature of from about 50° C. to about 120° C.

16. A process in accordance with claim 1 in which said film prior to treatment in (b) has a glass transition temperature of from about 70° C. to about 100° C.

17. A process in accordance with claim 1 in which said imagewise exposure defines exposed areas and unexposed areas, said resist is inert relative to silylation prior to exposure to radiation, and said regions on said film which are selectively susceptible to silylation are said exposed areas.

18. A process in accordance with claim 1 in which said imagewise exposure defines exposed areas and unexposed areas, said resist is susceptible to silylation prior to exposure to radiation, and said regions on said film which are selectively susceptible to silylation are said unexposed areas.

19. A process for forming a relief image on a substrate, said process comprising:

(a) coating said substrate with a film of a resist comprised of a noncrosslinked polymer having reactive protic groups;

(b) treating said film by a procedure which includes imagewise exposure of said film to radiation to crosslink said polymer in exposed regions by reaction between said reactive protic groups, thereby rendering unexposed regions selectively susceptible to silylation by reaction with a hydrolyzable moiety on an organosilane;

(c) treating said film with a composition in vapor form comprising a mixture of (i) a first organosilane having a single hydrolyzable moiety bonded to a silicon atom, and (ii) a second organosilane having at least two hydrolyzable moieties bonded to one or more silicon atoms, said first and second organosilanes having boiling points no more than about 5° C. apart, said first organosilane comprising at least about one-half of said mixture by weight; and (d) developing said film thus treated with an oxygen plasma.

20. A process in accordance with claim 19 in which said reactive protic groups are members selected from the group consisting of $-NH_2$, $-NH(alkyl)$, $-NH-$, $-OH$, $-SH$, $-COOH$, $-CHO$, $-SO_3H$, and $-P(O)(OH)_2$.

21. A process in accordance with claim 19 in which said reactive protic groups are members selected from the group consisting of $-NH_2$, $-OH$ and $-SH$.

22. A process in accordance with claim 19 in which said reactive protic groups are $-OH$ groups.

23. A process in accordance with claim 19 in which said reactive protic groups are $-OH$ groups bonded to phenyl rings.

24. A process in accordance with claim 19 in which said noncrosslinked polymer is a member selected from the group consisting of novolacs, cresol novolacs, and polyvinylphenols.

* * * * *